US012619802B2

(12) United States Patent
Loucks et al.

(10) Patent No.: US 12,619,802 B2
(45) Date of Patent: May 5, 2026

(54) COMPUTER-BASED SYSTEMS AND/OR COMPUTING DEVICES CONFIGURED FOR ORCHESTRATION OF ANONYMOUS BACKEND COMMUNICATIONS BETWEEN DEVICES AND MAINTAINING/UPDATING SIMULATION STATES AND METHODS OF USE THEREOF

(71) Applicant: Capital One Services, LLC, McLean, VA (US)

(72) Inventors: Eric Loucks, Broomfield, CO (US); Cruz Vargas, Ocean Springs, MS (US); Bryant Yee, Silver Spring, MD (US)

(73) Assignee: Capital One Services, LLC, McLean, VA (US)

( * ) Notice: Subject to any disclaimer, the term of this patent is extended or adjusted under 35 U.S.C. 154(b) by 889 days.

(21) Appl. No.: 17/956,674

(22) Filed: Sep. 29, 2022

(65) Prior Publication Data

US 2024/0111920 A1    Apr. 4, 2024

(51) Int. Cl.
*G06F 7/48* (2006.01)
*G06F 9/54* (2006.01)
*G06F 30/20* (2020.01)

(52) U.S. Cl.
CPC .............. *G06F 30/20* (2020.01); *G06F 9/543* (2013.01)

(58) Field of Classification Search
CPC ......... G06F 30/20; G06F 9/5038; G06F 9/543
See application file for complete search history.

(56) References Cited

U.S. PATENT DOCUMENTS

| | | | |
|---|---|---|---|
| 9,571,460 B2 | 2/2017 | van Ham et al. | |
| 9,592,442 B2 | 3/2017 | Feng et al. | |
| 2005/0164793 A1* | 7/2005 | Merimovich | ....... G07F 17/3293 |
| | | | 463/42 |
| 2007/0184902 A1* | 8/2007 | Liu | .......... A63F 13/79 |
| | | | 463/42 |
| 2007/0184903 A1* | 8/2007 | Liu | .......... A63F 13/71 |
| | | | 463/42 |
| 2008/0076573 A1* | 3/2008 | Loehrer | .............. G07F 17/3232 |
| | | | 463/42 |
| 2009/0215541 A1* | 8/2009 | Liu | .......... A63F 13/30 |
| | | | 463/42 |
| 2010/0274702 A1* | 10/2010 | Tzroya | ................... G06Q 40/04 |
| | | | 705/37 |
| 2012/0197967 A1 | 8/2012 | Sivavakeesar | |
| 2020/0402367 A1* | 12/2020 | Oberberger | ......... G07F 17/3223 |

* cited by examiner

*Primary Examiner* — Nithya J. Moll
(74) *Attorney, Agent, or Firm* — GREENBERG TRAURIG, LLP

(57) ABSTRACT

A method includes determining a first state of a simulation being run by a system and sending first data indicative of the first state of the simulation to a first computing device. The method further includes receiving, after the first data is sent, second data from the first computing device. The second data includes at least one first instruction configured to cause a first move associated with the simulation and is formatted according to a specification. The method further includes determining a second state of the simulation based on the second data received from the first computing device and sending third data indicative of the second state of the simulation to a second computing device. The method further includes receiving, after sending the third data, fourth data from the second computing device. The fourth data includes at least one second instruction configured to cause a second move.

20 Claims, 11 Drawing Sheets

150

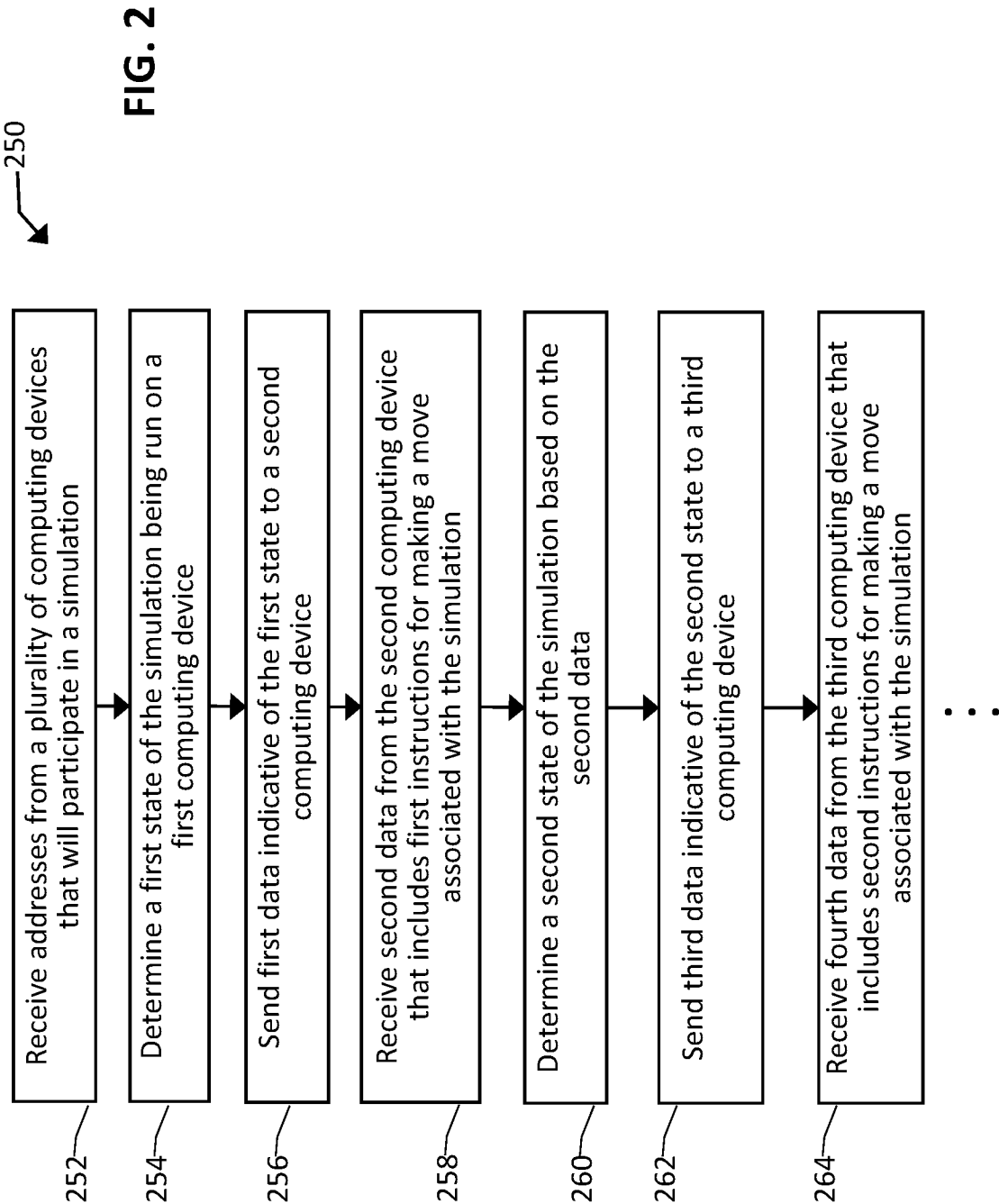

252 — Receive addresses from a plurality of computing devices that will participate in a simulation 254 — Determine a first state of the simulation being run on a first computing device 256 — Send first data indicative of the first state to a second computing device 258 — Receive second data from the second computing device that includes first instructions for making a move associated with the simulation 260 — Determine a second state of the simulation based on the second data 262 — Send third data indicative of the second state to a third computing device 264 — Receive fourth data from the third computing device that includes second instructions for making a move associated with the simulation

. . .

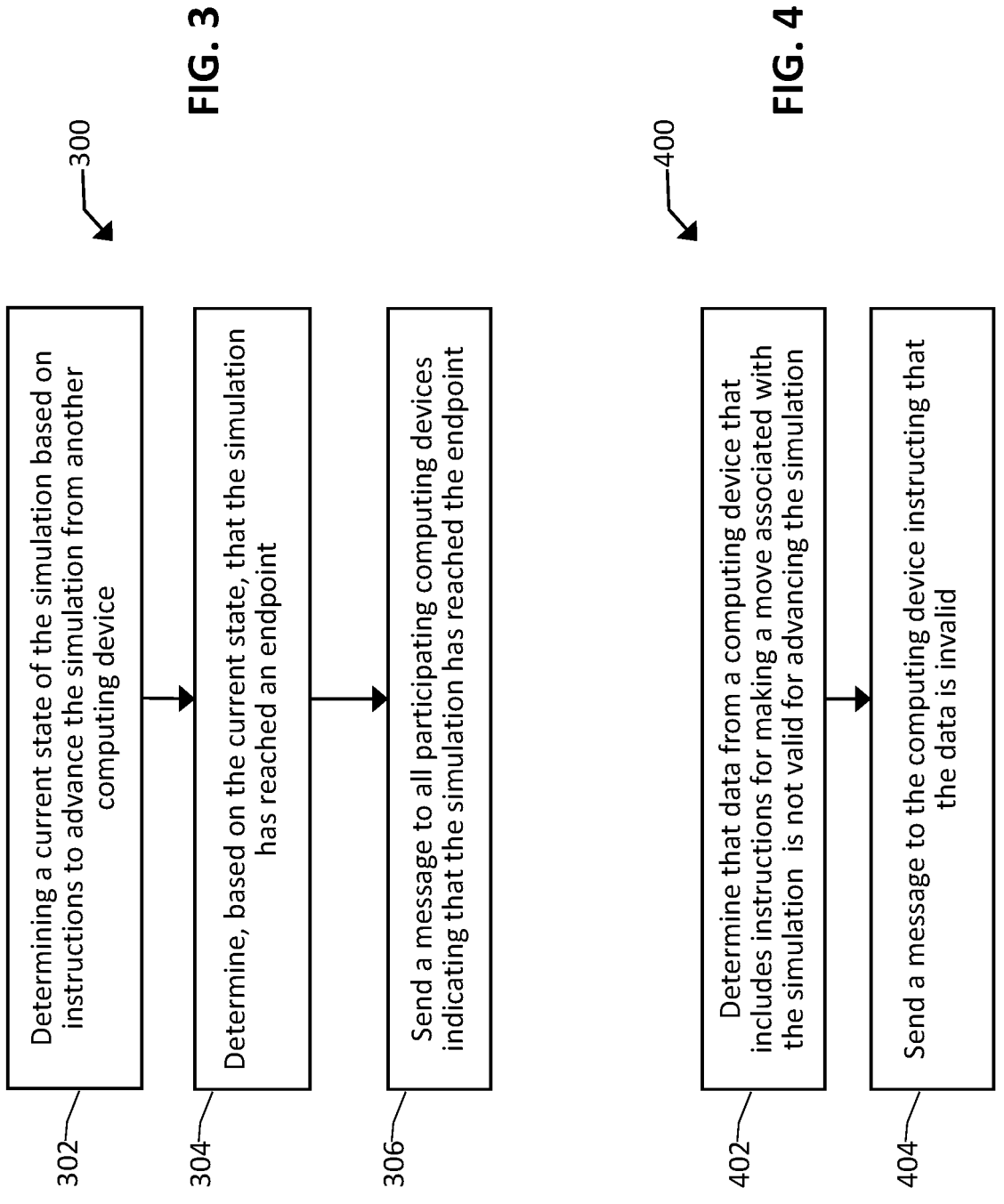

302 — Determining a current state of the simulation based on instructions to advance the simulation from another computing device 304 — Determine, based on the current state, that the simulation has reached an endpoint 306 — Send a message to all participating computing devices indicating that the simulation has reached the endpoint

402 — Determine that data from a computing device that includes instructions for making a move associated with the simulation is not valid for advancing the simulation 404 — Send a message to the computing device instructing that the data is invalid

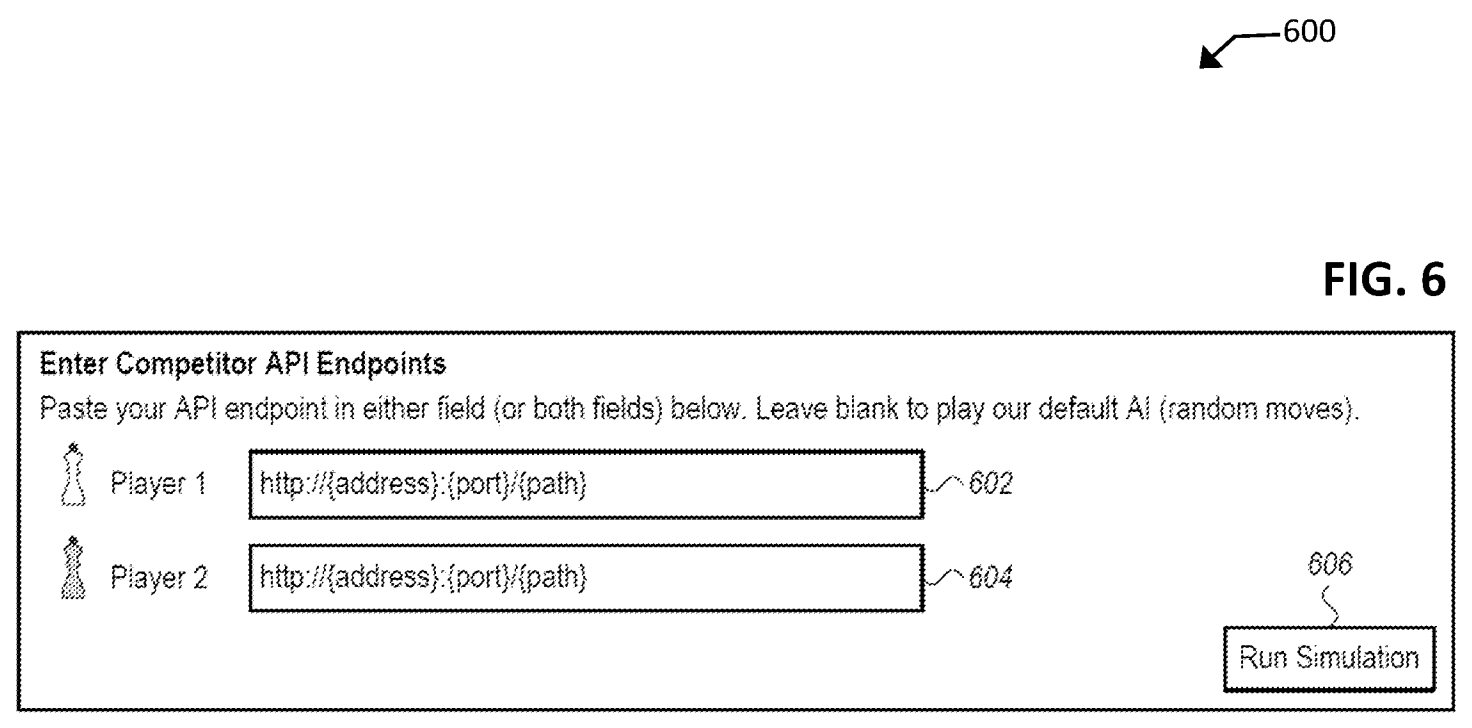

600

Enter Competitor API Endpoints

Paste your API endpoint in either field (or both fields) below. Leave blank to play our default AI (random moves).

Player 1    http://{address}:{port}/{path}    602

Player 2    http://{address}:{port}/{path}    604

606

Run Simulation

FIG. 6

COMPUTER-BASED SYSTEMS AND/OR COMPUTING DEVICES CONFIGURED FOR ORCHESTRATION OF ANONYMOUS BACKEND COMMUNICATIONS BETWEEN DEVICES AND MAINTAINING/UPDATING SIMULATION STATES AND METHODS OF USE THEREOF

TECHNICAL FIELD

The present disclosure generally relates to computer-based methods and systems for orchestration of anonymous backend communications between devices and maintaining/updating simulation states and methods of use thereof, such that different instruction sets may interact during a simulation without direct communication and without access to one another's instruction sets.

BACKGROUND

A computer network platform/system may include a group of devices (e.g., client devices (e.g., laptops, desktop computers, tablets, smartphone devices, internet of things (IOT) devices, etc.), servers, wireless routers or other networking devices) and other computing hardware devices that are linked together through one or more communication channels to facilitate communication and/or resource-sharing, including for implementation of instruction sets for competing with one another in a simulation.

SUMMARY

In some embodiments, the present disclosure provides an exemplary technically improved computer-based method that includes at least determining, by a processor of a first computing device, a first state of a simulation being run by the first computing device and sending, by the processor, first data indicative of the first state of the simulation to a second computing device. The method further includes receiving, by the processor after sending the first data, second data from the second computing device. The second data includes at least one first instruction configured to cause a first turn-based move associated with the simulation and is formatted according to a specification of an application programming interface (API) configured to facilitate communication between the first computing device and the second computing device. The method further includes determining, by the processor, a second state of the simulation based on the second data received from the second computing device and sending, by the processor, third data indicative of the second state of the simulation to a third computing device. The method further includes receiving, by the processor after sending the third data, fourth data from the third computing device. The fourth data includes at least one second instruction configured to cause a second turn-based move associated with the simulation and is formatted according to the specification of the API.

In some embodiments, the present disclosure provides an exemplary technically improved computer-based system that includes at least the following components of a memory and at least one processor coupled to the memory. The processor is configured to determine a first state of a simulation being run by the system and send first data indicative of the first state of the simulation to a first computing device. The processor is further configured to receive, after the first data is sent, second data from the first computing device. The processor is further configured to determine that the second data from the first computing device is not valid for advancing the simulation and send a message instructing that the second data is invalid to the first computing device. The processor is further configured to receive, after the message is sent, third data from the first computing device. The third data includes at least one first instruction configured to cause a first turn-based move associated with the simulation and is formatted according to a specification of an application programming interface (API) configured to facilitate communication between the system and the first computing device. The processor is further configured to determine a second state of the simulation based on the third data received from the first computing device and send fourth data indicative of the second state of the simulation to a second computing device. The processor is further configured to receive, after sending the fourth data, fifth data from the second computing device. The fifth data includes at least one second instruction configured to cause a second turn-based move associated with the simulation and is formatted according to the specification of the API.

In some embodiments, the present disclosure provides an exemplary technically improved non-transitory computer readable medium having instructions stored thereon that, upon execution by a first computing device, cause the first computing device to perform operations including determining a first state of a simulation being run by the first computing device and sending first data indicative of the first state of the simulation to a second computing device. The instructions further cause the first computing device to perform operations including receiving, after the first data is sent, second data from the second computing device. The second data includes at least one first instruction configured to cause a first move associated with the simulation and is formatted according to a specification configured to facilitate communication between the first computing device and the second computing device. The instructions further cause the first computing device to perform operations including determining a second state of the simulation based on the second data received from the second computing device and sending third data indicative of the second state of the simulation to a third computing device. The instructions further cause the first computing device to perform operations including receiving, after sending the third data, fourth data from the third computing device. The fourth data includes at least one second instruction configured to cause a second move associated with the simulation and is formatted according to the specification.

BRIEF DESCRIPTION OF THE DRAWINGS

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

FIG. 2 is a flowchart illustrating a process for orchestrating anonymous backend communications between devices and maintaining/updating a simulation state based thereon in accordance with one or more embodiments of the present disclosure.

FIG. 3 is a flowchart illustrating a process for determining that a simulation being run has reached an endpoint in accordance with one or more embodiments of the present disclosure.

FIG. 4 is a flowchart illustrating a process for determining that instructions to update the state of a simulation received from a computing device are invalid in accordance with one or more embodiments of the present disclosure.

FIG. 6 is a diagram illustrating an example interface for entering competitor endpoints used for running a simulation and receiving instructions for updating the state of the simulation in accordance with one or more embodiments of the present disclosure.

DETAILED DESCRIPTION

Figure 1:
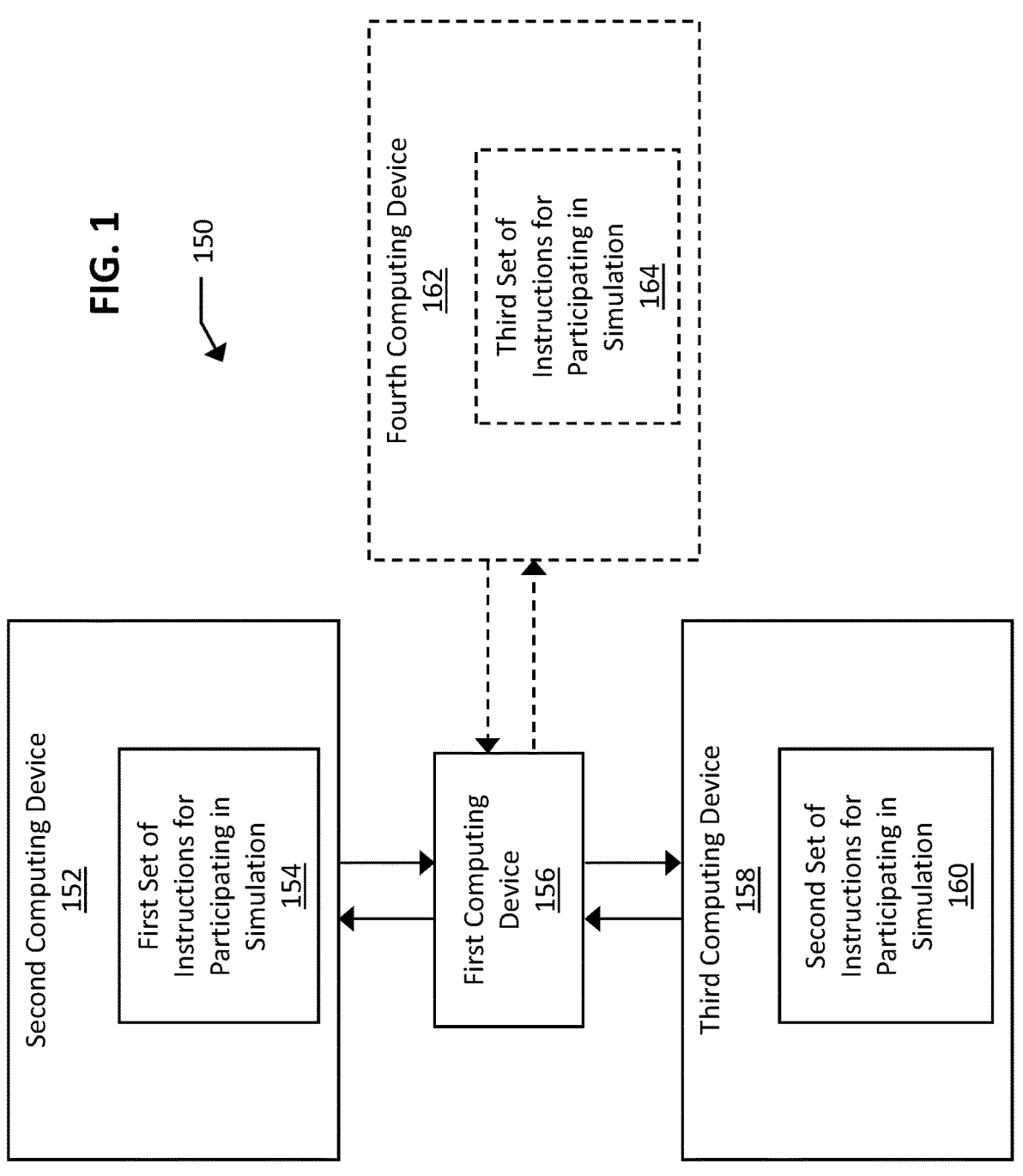
FIG. 1 is a diagram illustrating a system for orchestrating anonymous backend communications between devices and maintaining/updating a simulation state based thereon in accordance with one or more embodiments of the present disclosure.

Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

In addition, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

It is understood that at least one aspect/functionality of various embodiments described herein can be performed in real-time and/or dynamically. As used herein, the term "real-time" is directed to an event/action that can occur instantaneously or almost instantaneously in time when another event/action has occurred. For example, the "real-time processing," "real-time computation," and "real-time execution" all pertain to the performance of a computation during the actual time that the related physical process (e.g., a user interacting with an application on a mobile device) occurs, in order that results of the computation can be used in guiding the physical process.

As used herein, the term "dynamically" and term "automatically," and their logical and/or linguistic relatives and/or derivatives, mean that certain events and/or actions can be triggered and/or occur without any human intervention. In some embodiments, events and/or actions in accordance with the present disclosure can be in real-time and/or based on a predetermined periodicity of at least one of: nanosecond, several nanoseconds, millisecond, several milliseconds, second, several seconds, minute, several minutes, hourly, several hours, daily, several days, weekly, monthly, etc.

As used herein, the term "runtime" corresponds to any behavior that is dynamically determined during an execution of a software application or at least a portion of software application.

In some embodiments, exemplary inventive, specially programmed computing systems/platforms with associated devices are configured to operate in the distributed network environment, communicating with one another over one or more suitable data communication networks (e.g., the Internet, satellite, etc.) and utilizing one or more suitable data communication protocols/modes such as, without limitation, IPX/SPX the ye, X.25, AX.25, AppleTalk™, TCP/IP (e.g., HTTP), Bluetooth™, near-field wireless communication (NFC), RFID, Narrow Band Internet of Things (NBIOT), 3G, 4G, 5G, GSM, GPRS, WiFi, WiMax, CDMA, satellite, ZigBee, and other suitable communication modes.

Described herein are methods, systems, computer readable media, etc. for running a simulation (e.g., a game, competition, etc.), where a state of the simulation is updated based on instructions (e.g., to take a turn in a game, make a move in the game) received from different computing devices, which may be operating different artificial intelligence (AI) algorithms (also referred to herein as AIs) to make moves or take turns with respect to the simulation. In this way, for example, two different AI algorithms operating on two different computing devices may compete against one another in a simulation, such as a game of chess, while the simulation itself is being hosted and advanced on a third computing device.

The third computing device may serve as an intermediary between the two devices on which the AI algorithms are operating so that, for example, one AI algorithm cannot see the moves the other AI algorithm is making, gain access to the other AI algorithm, etc. As such, the methods, systems, computer readable media, etc. provide for a fair and secure way of operating a simulation or competition where, for example, two participating AI algorithms may be hostile to one another or otherwise competing to beat the other AI algorithm in a competition related to the simulation.

In an example, the methods, systems, computer readable media, etc. may provide a platform for battling chess AIs in a way that users or participants may not have to trust the platform server or each other by sharing their code. By implementing the embodiments described herein, competing AI code would not need to be uploaded to a server to participate in the simulation or competition. Rather, the AIs can operate on a user's computing device that created the AI, and just communicate how to participate in the simulation (e.g., communicate turns or moves the AI wants to take) to the server or device running the game or simulation without actually sending the code for the AI to that server or device.

The server or device that serves as the platform for the simulation or competition may update the devices on which the AIs are operating with a state of the simulation or competition (e.g., after one AI instructs a move to be made), and the device with the AIs may then use the state information to determine a next move they would like to make. As such, the embodiments described herein provide a way to keep the AIs confidential while allowing the AIs to interact and participate in the simulation/competition.

The device in the middle of the two AIs therefore serves as a central platform that acts as the orchestrator between the two AIs. The AIs and the central device may also be configured to communicate with one another in a common or expected format, so that the responses and requests passing between the devices are recognizable and may be used to advance the simulation/competition. As long as the end user devices' AI respects and uses a designated format (e.g., a particular application programming interface (API)), any desired AI may be built by the participants as the code associated with the AIs themselves need not be compatible with a competitor device or the central device outside of using the designated format for passing communications between an AI device and the central device. In other words, a user who has developed they AI code for participating in a simulation may host the code on their own device and never share their code despite participating in the simulation. Advantageously, confidentiality of the AI code may be facilitated via an orchestrator device in the middle that works via formatted (e.g., API) calls.

As such, the methods, systems, and computer readable media described herein provide the technical improvement of preventing computing devices running AI code from having their AI code exposed to another device running an AI code, and also prevents any computing devices running a simulation or competition in which AIs are participating from accessing or seeing the AI code running on other computing devices. In particular, a computing device facilitating the competition or running the simulation maintains a state of the simulation and sends state information to at least the computing device from which the next move should be made or turn should be taken, upon which the state information will be updated by the facilitating computing device.

Accordingly, a computing device running AI code may receive state information about the simulation and respond to the facilitating computing device with a next move or turn. The facilitating device may then update the state of the simulation and send the updated state of the simulation to another computing device running a second AI code, so that the second AI code may respond with a move or turn based on the updated state of the simulation.

This process may repeat with the two computing devices running the two respective AI codes, or may also involve additional computing devices running additional AI codes. In this way, the facilitating device may maintain a state of the simulation or competition without ever having to execute the AI codes stored and run on other computing devices. This may prevent, for example, AI codes from potentially acting maliciously and gaining access to one another, for example where multiple AI codes are executed on the same device that the simulation or competition is being run. Such a system can increase trust and integrity for the competition between participants, as the participants would not need to upload their AI code into another computing device that they do not control.

The various embodiments described herein therefore provide improved technical solutions for various technical problems that occur in previous methods for implementing competitions or simulations in which multiple competing AI codes may be used. The systems and methods provided herein specifically provide for at least a computing device that facilitates a simulation or competition between multiple devices each running a respective AI code, such that instructions for participating in the simulation or competition are passed between the facilitating device and the competing devices using a common format (e.g., API) without the AI codes ever being uploaded to or executed on an untrusted device. Thus, the technical aspects of using this facilitating device provides a significant technical advantage over systems that do not provide the opportunity for participants to keep their AI codes private.

In various embodiments, different aspects are described with respect to FIGS. 9-12 that are described in further detail below. Any combination of the various computing components and aspects of FIGS. 9-12 may be used various embodiments described herein. For example, users who have designed and area executing AI code to participate in a simulation may use any of client devices 102, 103, 104, or 202a through 202n to interact with a computing device facilitating a simulation and updating a state thereof as described herein. As another example, the devices facilitating the simulation and updating the state thereof may be any of the server devices 106, 107, 204, or 213; network databases 207 or 215; and/or one or more cloud components 225 that communicate with the client devices through the networks 105 or 206. Any of the server devices 106, 107, 204, or 213; the network databases 207 or 215; and/or the one or more cloud components 225 may execute or implement the competition or simulations as described herein to users to compete with their AI codes.

In various embodiments, any of the client devices 102, 103, 104, or 202a through 202n may additionally or alternatively be used to implement or execute the methods or processes described herein, such as facilitating a simulation or competition. In any event, one or more of the computing devices, systems, etc. may be in communication with any or all of the other devices shown in FIGS. 9-12 to implement the systems and methods described herein.

For example, client device 102 may implement an AI code that competes with an AI code on client device 104 via a simulation run and maintained on the network server 107. In such an example, the client devices 102 and 104 may communicate with the network server 107 via the network 105. In particular, the network server 107 may send state information regarding the simulation the client devices 102 and 104 via the network 105, and the client devices 102 and 104 may take turns to make a move with respect to the simulation by communicating state change information back to the network server 107 via the network 105. The components shown in FIGS. 9-12 are described in greater detail below after the discussions of FIGS. 1-8 below.

FIG. 1 is a diagram illustrating a system 150 for orchestrating anonymous backend communications between devices and maintaining/updating a simulation state based thereon in accordance with one or more embodiments of the present disclosure. In particular, a first computing device

156 may maintain and update a simulation or competition as described herein. Other computing devices, including one or more of a second computing device 152, third computing device 158, and/or a fourth computing device 162 may participate in the competition/simulation.

The second computing device 152 may have a first set of instructions for participating in a simulation 154 (referred to herein as AI code 154), the third computing device 158 may have a second set of instructions for participating in a simulation 160 (referred to herein as AI code 160), 8, and the fourth computing device 162 may have a third set of instructions for participating in a simulation 164 (referred to herein as AI code 164).

The first computing device 156 may therefore facilitate a competition or simulation between any combination of the second, third, and/or fourth computing devices 152, 158, 162 as described herein. For example, the second computing device 152 may compete against the third computing device 158. The winner of the competition between the second and third computing devices 152, 158 may then compete against the fourth computing device in a new simulation or competition facilitated by the first computing device 156.

In various embodiments, more than two AI codes may participate in a simulation or competition, such that each of the second, third, and/or fourth computing devices 152, 158, 162 are all competing at the same time in the simulation or competition facilitated by the first computing device 156. In various embodiments, more or less devices may also be present to participate in a competition, play computing devices already shown in FIG. 1, etc.

FIG. 2 is a flowchart illustrating a process 250 for orchestrating anonymous backend communications between devices and maintaining/updating a simulation state based thereon in accordance with one or more embodiments of the present disclosure.

At an operation 252, a first computing device that is facilitating a simulation or competition (e.g., the first computing device 156 of FIG. 1) may receive addresses from one or more computing devices that will participate in the simulation. These may be input, for example, into a user interface at the facilitating computing device or the participating computing devices themselves. FIG. 6, discussed further below, shows an example interface at the facilitating computing device where addresses for two different competing devices may be entered.

At an operation 254, the facilitating computing device determines a first state of a simulation being run by the first computing device. This may be, for example, a setup of an initial competition or simulation state. For example, if the AI codes from different computing devices are competing in a game of chess, the initial state information may indicate the initial setup of a chess board.

At an operation 256, the facilitating computing device sends first data indicative of the first state of the simulation to a second computing device (e.g., the second computing device 152 of FIG. 1). At an operation 258, the facilitating computing device may receive, after sending the first data, second data from the second computing device. The second data may include at least one first instruction (e.g., an AI code) configured to cause a first turn-based move associated with the simulation. In other words, the second computing device may send back information configured to cause a move or turn with respect to the simulation.

The second data indicative of the second computing devices turn or move may be formatted according to a specification of an application programming interface (API) configured to facilitate communication between the first computing device and the second computing device. In various embodiments, other types of languages, specifications, or formatting rules may be used to facilitate communication between devices. As long as the computing devices seeking to communicate with one another use a common protocol, language, specification, etc. that the computing devices are able to understand, the devices may be successful in communicating with one another to receive or send state information, receive or send data indicative of a turn or move with respect to the simulation, etc. The turn or move may be related, for example, to a turn-based strategy game that is being implemented and facilitated on the facilitating computing device.

At an operation 260, a second state of the simulation is determined based on the second data received from the second computing device. That determination may be, for example, implementing the first turn-based move made by the first computing device.

At an operation 262, the facilitating computing device may send information representative of the determined second state of the simulation to a third computing device (e.g., the third computing device 158 of FIG. 1). At an operation 264, the facilitating computing device may receive data indicative of a turn or move from the third computing device, similar to how the facilitating computing device received information relating to a turn or move from the second computing device at the operation 258. The information for the turn or move from the third computing device may also be formatted according to an API, protocol, etc.

In various embodiments, as described herein, the second computing device and the third computing device cannot and do not directly communicate with one another, so that the AI code being implemented on each respective device and communications related to the simulation are not exposed to or traceable by competing devices. As such, the state information of the simulation may also be communicated to the second computing device and the third computing device only by the first computing device.

FIG. 2 is shown with an ellipsis, as the operations 254 to 264 may happen repeatedly, such that the computing devices competing in the simulation may continue to receive state updates and making turns or moves with respect to the simulation. Similarly, the computing device facilitating the competition or simulation may continue updating a state of the simulation, sending out the state information, and receiving subsequent turns or moves (subsequent data) from the competing computing devices. In various embodiments, the facilitating computing device may eventually determine that the simulation has reached an endpoint (e.g., as discussed with respect to FIG. 3 herein). In various embodiments, the facilitating computing device may also determine at varying points of facilitating a simulation or competition that a move made with respect to the simulation is invalid (e.g., as discussed with respect to FIG. 4 herein). As such, the first computing device may be configured to maintain a current state of the simulation throughout the course of the simulation being run by the first computing device.

In various embodiments, the facilitating computing device may also implement a time limit to make move (e.g., receive instructions from a competing device to update the state of the simulation). The time limit may be a predetermined amount that the participant devices agree to or that the facilitating device sets. If the time limit is exceeded, the participating device that exceeds the time limit may forfeit the competition, may receive a warning message generated by the facilitating device, etc.

In various embodiments, instead of a turn based game, the simulation or competition may be or may be related to a real-time strategy game, such that the moves made are real-time strategy game moves. In such embodiments, the facilitating device may update all competing devices consistently/continuously at a predetermined rate (e.g., a clock rate, refresh rate, etc.). In such embodiments, the state of the simulation may be updating near constantly and the AI codes may respond with corresponding moves near constantly. Accordingly, the state information of the simulation may be continuously and simultaneously communicated to other participating computing devices by the facilitating computing device FIG. 3 is a flowchart illustrating a process 300 for determining that a simulation being run has reached an endpoint in accordance with one or more embodiments of the present disclosure. For example, the simulation may be ended where one computing device's AI code has won a game related to the simulation, where there is a draw or stalemate, or where some other endpoint of the simulation has been reached.

At an operation 302, a facilitating computing device determines a state of a simulation based on a most recent instruction from a participating computing device to take a turn or update a state of the simulation. At an operation 304, the facilitating computing device determines that the simulation has reached an endpoint. That determination may be made based on the state of the simulation (e.g., that a player's king will inevitably be taken on a next turn in a simulated game of chess).

At an operation 306, the facilitating device may send a message indicating that the simulation has reached the endpoint to the participating computing devices. Such a message may cause a message to be displayed at the participating computing devices indicating a winner, may cause the participating computing devices to stop replying with state change information (e.g., to stop taking turns or making moves in the competition), and/or may cause the participating computing devices to disconnect from the facilitating computing device or otherwise stop communicating with the computing device. As such, the endpoint of the simulation may be associated with an end of a game being played between competing computing devices and associated AI codes, and the facilitating computing device may further determine a winner of the game/competition.

FIG. 4 is a flowchart illustrating a process 400 for determining that instructions to update the state of a simulation received from a computing device are invalid in accordance with one or more embodiments of the present disclosure. At an operation 402, a facilitating computing device may determine that data from a competing computing device is not valid for advancing a simulation. That data may be determined to be invalid based on the data not being formatted correctly, such as according to a specification of an API. That data may also be determined to be invalid based on the data including instructions for a turn or move associated with the simulation that is not compatible with the first state of the simulation. For example, if the simulation is a game of chess, a participating device may not instruct the facilitating device to update the simulation by moving their queen if that player's respective queen has already been taken or removed from the game.

At an operation 404, the facilitating device sends a message (e.g., to the computing device that made the invalid move) instructing that the data is invalid. The computing device may be able to re-send instructions to the facilitating device to make a valid move in response to the error message.

Figure 5:
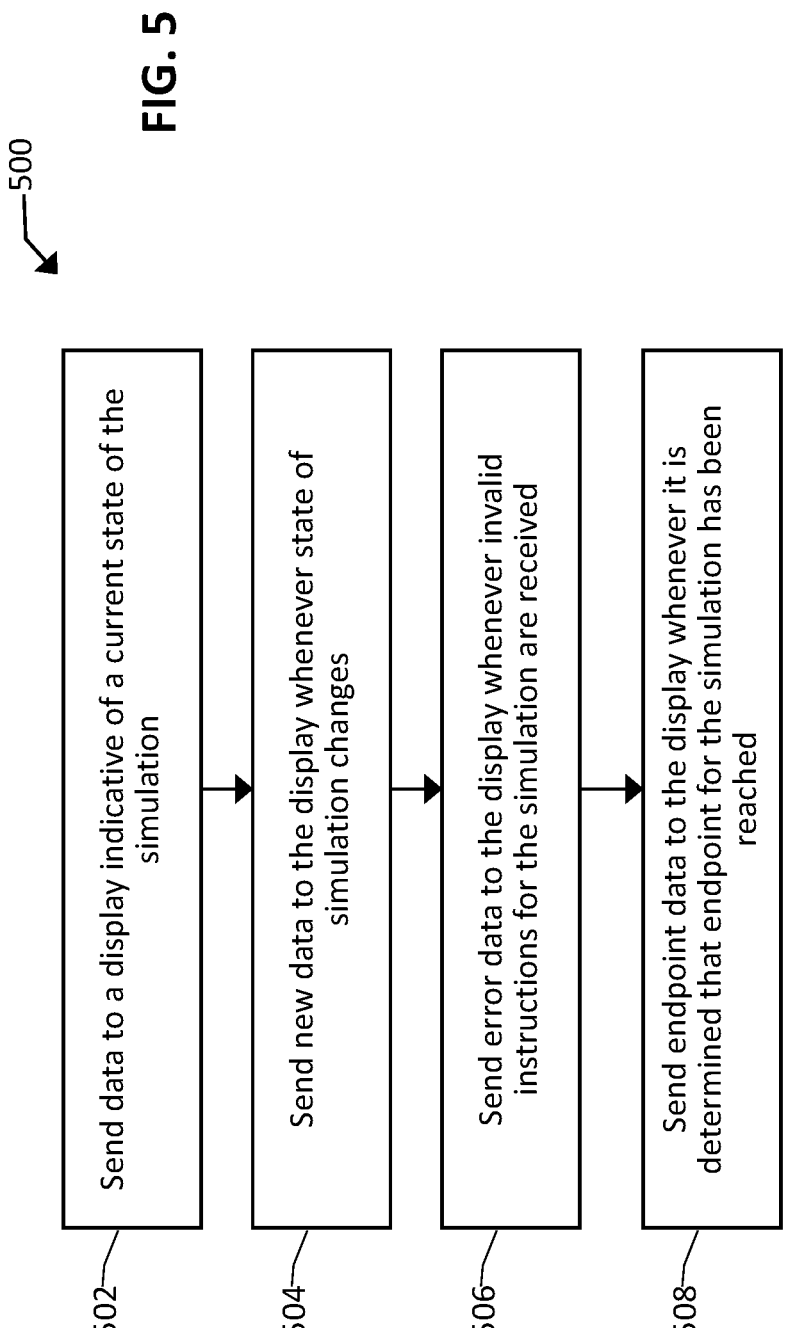
FIG. 5 is a flowchart illustrating a process for displaying information relating to a simulation being run in accordance with one or more embodiments of the present disclosure.

FIG. 5 is a flowchart illustrating a process 500 for displaying information relating to a simulation being run in accordance with one or more embodiments of the present disclosure. Various examples of display interfaces are shown in and described with respect to FIGS. 6-8. The operations of the process 500 may be implemented at any time during a simulation. Not all of the operations of the process 500 may be performed during a given simulation (e.g., between a start and end of a simulation). In other words, the operations of the process 500 may only be implemented when appropriate based on the state of a simulation, based on information received from the participating computing devices at a facilitating computing device, etc.

While the process 500 refers to a single display, there may be multiple displays, such as shown on any one or more of a facilitating device and competing devices. For example, a facilitating device and/or the competing devices may each have a display on which a current (or last known) state of a game is displayed, on which error messages may be displayed, on which a message indicating a winner may be displayed, etc. In other words, the display described herein may exist on one or more devices, and the information output to that display may be output on one or more devices.

At an operation 502, data indicative of a current state of a simulation is sent to a display, so that users can see a progress of the simulation. At an operation 504, new data may be sent to the display whenever a state of the simulation changes.

At an operation 506, error data, such as when a turn or move is invalid, may be sent to the display. In this way, the display may indicate to a user when an invalid move has been made.

At an operation 508, endpoint data (e.g., a winner identity and information that the game has ended) may be sent to a display. In this way, users may know when a simulation is complete and any results of that simulation.

FIG. 6 is a diagram illustrating an example interface 600 for entering competitor endpoints used for running a simulation and receiving instructions for updating the state of the simulation in accordance with one or more embodiments of the present disclosure. The addresses of two player devices may be entered at fields 602 and 604. A button 606 may be selected once the addresses are entered to run the simulation using the AI codes stored at the addresses. The interface 600 may be displayed, for example at a facilitating device. A similar interface that only allows the input of one address may alternatively be displayed at each respective competing computing device, so that the address for each competing device may be entered. In contrast, competing devices may also receive an address of the facilitating device, so that the competing devices may communicate with the facilitating device to implement the simulation as described herein.

Figure 7:
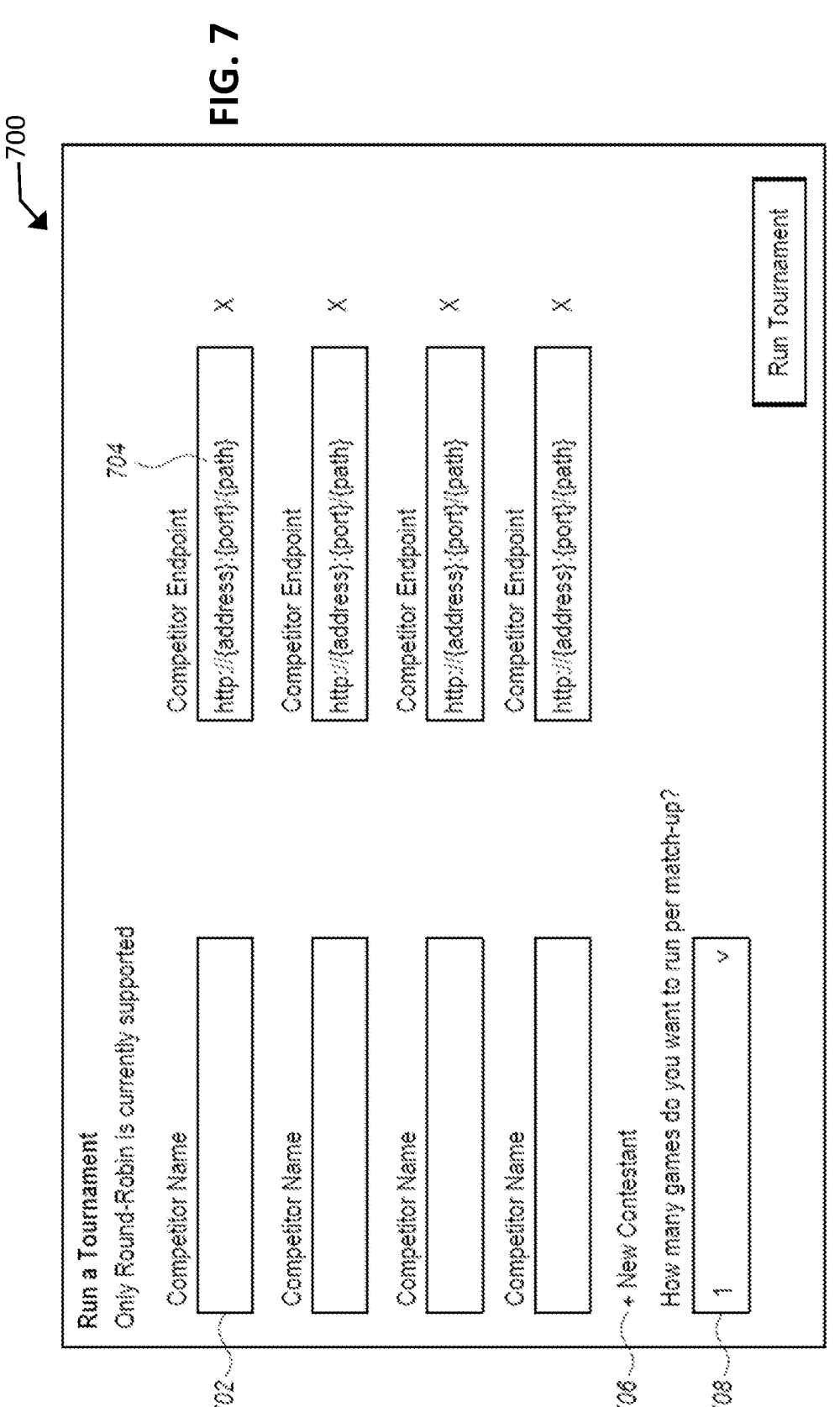
FIG. 7 is a diagram illustrating an example interface for entering multiple competitor endpoints used for running a tournament using simulations and receiving instructions for updating the state of the simulations in accordance with one or more embodiments of the present disclosure.

FIG. 7 is a diagram illustrating an example interface 700 for entering multiple competitor endpoints used for running a tournament using simulations and receiving instructions for updating the state of the simulations in accordance with one or more embodiments of the present disclosure. This interface may be used at a facilitating device, for example, where multiple competitors may be entering in a tournament (e.g., elimination tournament, round robin tournament, etc.). As such, a facilitating device may implement a tournament of a desired type by running more than one simulation involving different competitors based on the tournament type.

A field 702 may be used to enter a competitor name. A field 704 may be used to enter a competitor device address. A button 706 may be used to add additional competitors, and a drop down menu 708 may allow a user to select how many simulations the system should be run for a given matchup in a tournament (e.g., 5 simulations may be run per matchup for a best of 5 format).

Figure 8:
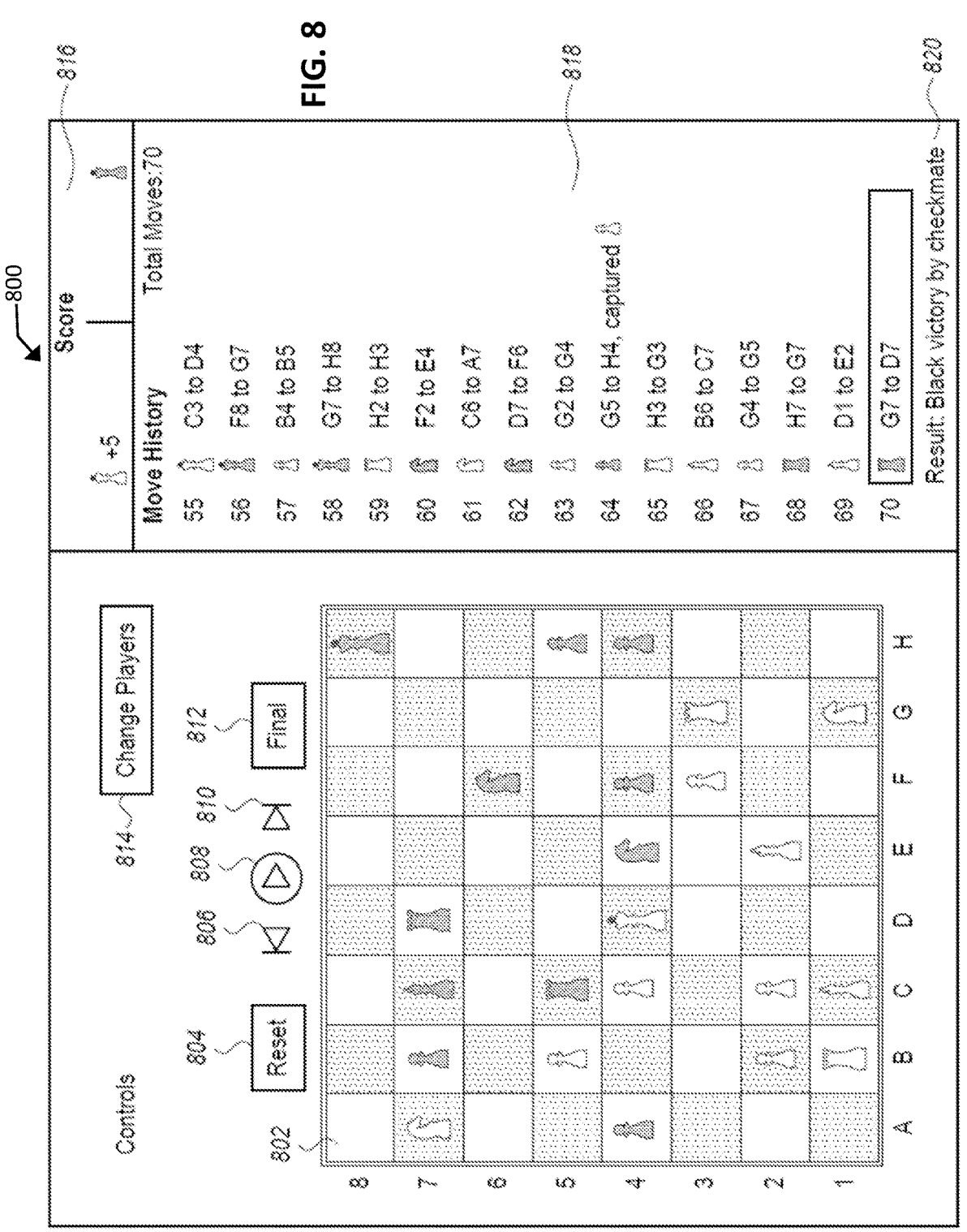
FIG. 8 is a diagram illustrating an example interface for displaying information relating to a simulation being run and instructions received for updating the state of the simulation in accordance with one or more embodiments of the present disclosure.

FIG. 8 is a diagram illustrating an example interface 800 for displaying information relating to a simulation being run and instructions received for updating the state of the simulation in accordance with one or more embodiments of the present disclosure. In other words, the interface 800 may be used to display a current state of a simulation on any of the computing devices involved in the simulation.

Elements of the interface 800 may also be used to control the simulation. As such, in various embodiments, some or all of the elements of the interface 800 may be desirable to display only on the facilitating device, such that competitors are not able to end, finalize, or restart a simulation.

Display element 802 shows an example state of a simulated chess game. Button 804 may be selected to reset a simulation to its original or first state. Buttons 806 and 810 may be selected to move a turn-based simulation backward or forward turns, which may be reflected in the display element 802. Button 808 may be selected to start or pause a simulation. Button 812 may be selected to finalize a simulation once it has reached an endpoint (e.g., to give users time to see the final state of the simulation before a new simulation is configured or begun). Button 814 may be selected to change players of the simulation (e.g., to change the interface to that shown in FIG. 6 or 7).

Display element 816 may further track a state of the simulation, such as a current score or the last move made in the simulation. Display element 818 may include a log of some or all previous moves made in the simulation, and may include an indication of the most recently made move (e.g., the highlighting of move 70). Display element 820 may further indicate endpoint information, such as that the game is over and may identify a winner of the game/simulation (e.g., black team).

As such, described herein are systems, methods, and computer readable media for implementing a simulation, game, or competition where the participants are different AI codes being executed on different computing devices. The simulation, game, or competition may be executed on yet another computing device that communicates with the devices on which the AI codes are run, so that none of the AI codes nor the execution code for the simulation are directly exposed to one another. In this way, AI codes may compete with one another in a way that does not endanger or expose the AI code itself.

The material disclosed herein may be implemented in software or firmware or a combination of them or as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

The aforementioned examples are, of course, illustrative and not restrictive.

As used herein, the term "user" shall have a meaning of at least one user. In some embodiments, the terms "user", "subscriber" "consumer" or "customer" should be understood to refer to a user of an application or applications as described herein, and/or a consumer of data supplied by a data provider. By way of example, and not limitation, the terms "user" or "subscriber" can refer to a person who receives data provided by the data or service provider over the Internet in a browser session or can refer to an automated software application which receives the data and stores or processes the data.

Figure 9:
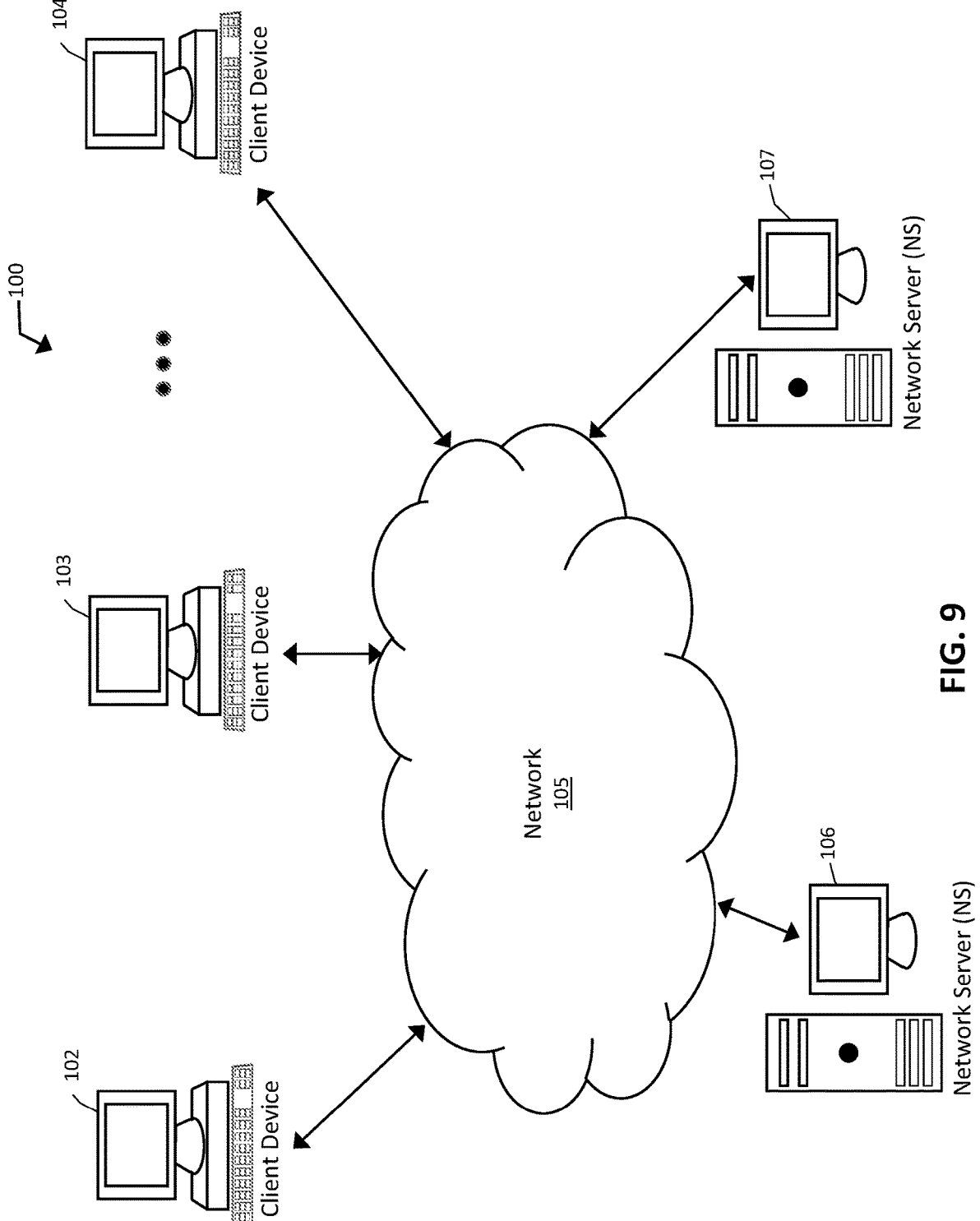
FIG. 9 is a block diagram depicting a computer-based system and platform in accordance with one or more embodiments of the present disclosure.

FIG. 9 is a block diagram depicting a computer-based system and platform in accordance with one or more embodiments of the present disclosure. However, not all of these components may be required to practice one or more embodiments, and variations in the arrangement and type of the components may be made without departing from the spirit or scope of various embodiments of the present disclosure. In some embodiments, the exemplary inventive computing devices and/or the exemplary inventive computing components of the exemplary computer-based system/platform 100 may be configured to manage a large number of members and/or concurrent transactions, as detailed herein. In some embodiments, the exemplary computer-based system/platform 100 may be based on a scalable computer and/or network architecture that incorporates varies strategies for assessing the data, caching, searching, and/or database connection pooling. An example of the scalable architecture is an architecture that is capable of operating multiple servers.

In some embodiments, referring to FIG. 9, members 102-104 (e.g., clients) of the exemplary computer-based system/platform 100 may include virtually any computing device capable of receiving and sending a message over a network (e.g., cloud network), such as network 105, to and from another computing device, such as servers 106 and 107, each other, and the like. In some embodiments, the member devices 102-104 may be personal computers, multiprocessor systems, microprocessor-based or programmable consumer electronics, network PCs, and the like. In some embodiments, one or more member devices within member devices 102-104 may include computing devices that typically connect using a wireless communications medium such as cell phones, smart phones, pagers, walkie talkies, radio frequency (RF) devices, infrared (IR) devices, CBs, integrated devices combining one or more of the preceding devices, or virtually any mobile computing device, and the like. In some embodiments, one or more member devices within member devices 102-104 may be devices that are capable of connecting using a wired or wireless communication medium such as a PDA, POCKET PC, wearable computer, a laptop, tablet, desktop computer, a netbook, a video game device, a pager, a smart phone, an ultra-mobile personal computer (UMPC), and/or any other device that is equipped to communicate over a wired and/or wireless communication medium (e.g., NFC, RFID, NBIOT, 3G, 4G, 5G, GSM, GPRS, WiFi, WiMax, CDMA, satellite, ZigBee, etc.). In some embodiments, one or more member devices within member devices 102-104 may include may run one or more applications, such as Internet browsers, mobile applications, voice calls, video games, videoconferencing, and email, among others. In some embodiments, one or more member devices within member devices 102-104 may be configured to receive and to send web pages, and the like. In some embodiments, an exemplary specifically programmed browser application of the present disclosure may be configured to receive and display graphics, text, multimedia, and the like, employing virtually any web based language, including, but not limited to Standard Generalized Markup Language (SMGL), such as HyperText Markup Language (HTML), a wireless application protocol (WAP), a Handheld Device Markup Language (HDML), such as Wireless Markup Language (WML), WMLScript, XML, JavaScript, and the like. In some embodiments, a member device within member devices 102-104 may be specifically programmed by either Java, .Net, QT, C, C++ and/or other suitable programming language. In some embodiments, one or more member devices within member devices 102-104 may be specifically programmed include or execute an application to perform a variety of possible tasks, such as, without limitation, messaging functionality, browsing, searching, playing, streaming or displaying various forms of content, including locally stored or uploaded messages, images and/or video, and/or games.

In some embodiments, the exemplary network 105 may provide network access, data transport and/or other services to any computing device coupled to it. In some embodiments, the exemplary network 105 may include and implement at least one specialized network architecture that may be based at least in part on one or more standards set by, for example, without limitation, Global System for Mobile communication (GSM) Association, the Internet Engineering Task Force (IETF), and the Worldwide Interoperability for Microwave Access (WiMAX) forum. In some embodiments, the exemplary network 105 may implement one or more of a GSM architecture, a General Packet Radio Service (GPRS) architecture, a Universal Mobile Telecommunications System (UMTS) architecture, and an evolution of UMTS referred to as Long Term Evolution (LTE). In some embodiments, the exemplary network 105 may include and implement, as an alternative or in conjunction with one or more of the above, a WiMAX architecture defined by the WiMAX forum. In some embodiments and, optionally, in combination of any embodiment described above or below, the exemplary network 105 may also include, for instance, at least one of a local area network (LAN), a wide area network (WAN), the Internet, a virtual LAN (VLAN), an enterprise LAN, a layer 3 virtual private network (VPN), an enterprise IP network, or any combination thereof. In some embodiments and, optionally, in combination of any embodiment described above or below, at least one computer network communication over the exemplary network 105 may be transmitted based at least in part on one of more communication modes such as but not limited to: NFC, RFID, Narrow Band Internet of Things (NBIOT), ZigBee, 3G, 4G, 5G, GSM, GPRS, WiFi, WiMax, CDMA, satellite and any combination thereof. In some embodiments, the exemplary network 105 may also include mass storage, such as network attached storage (NAS), a storage area network (SAN), a content delivery network (CDN) or other forms of computer or machine readable media.

In some embodiments, the exemplary server 106 or the exemplary server 107 may be a web server (or a series of servers) running a network operating system, examples of which may include but are not limited to Microsoft Windows Server, Novell NetWare, or Linux. In some embodiments, the exemplary server 106 or the exemplary server 107 may be used for and/or provide cloud and/or network computing. Although not shown in FIG. 9, in some embodiments, the exemplary server 106 or the exemplary server 107 may have connections to external systems like email, SMS messaging, text messaging, ad content providers, etc. Any of the features of the exemplary server 106 may be also implemented in the exemplary server 107 and vice versa.

In some embodiments, one or more of the exemplary servers 106 and 107 may be specifically programmed to perform, in non-limiting example, as authentication servers, search servers, email servers, social networking services servers, SMS servers, IM servers, MMS servers, exchange servers, photo-sharing services servers, advertisement providing servers, financial/banking-related services servers, travel services servers, or any similarly suitable service-base servers for users of the member computing devices 101-104.

In some embodiments and, optionally, in combination of any embodiment described above or below, for example, one or more exemplary computing member devices 102-104, the exemplary server 106, and/or the exemplary server 107 may include a specifically programmed software module that may be configured to send, process, and receive information using a scripting language, a remote procedure call, an email, a tweet, Short Message Service (SMS), Multimedia Message Service (MMS), instant messaging (IM), internet relay chat (IRC), mIRC, Jabber, an application programming interface, Simple Object Access Protocol (SOAP) methods, Common Object Request Broker Architecture (CORBA), HTTP (Hypertext Transfer Protocol), REST (Representational State Transfer), or any combination thereof.

Figure 10:
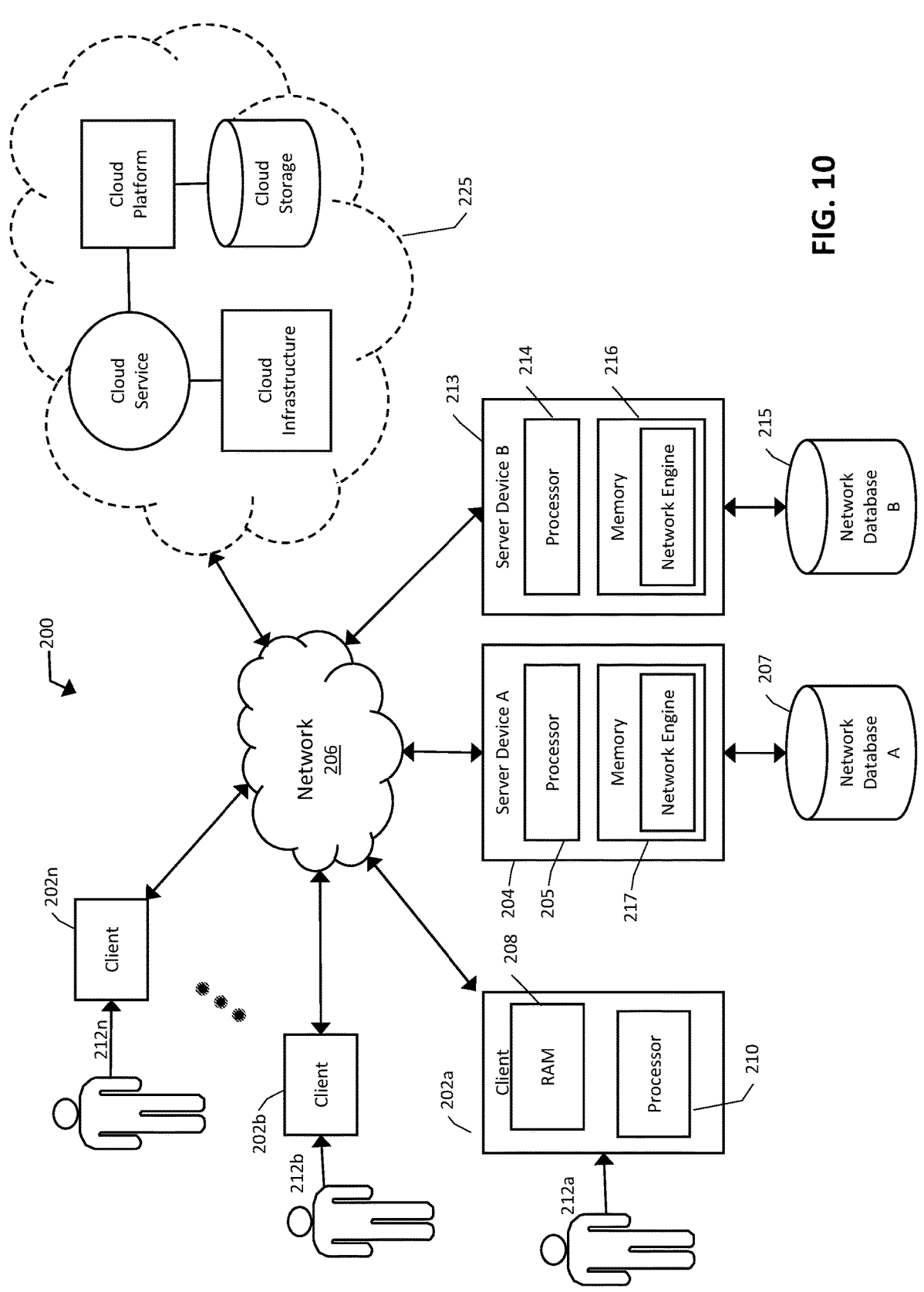
FIG. 10 is a block diagram depicting another computer-based system and platform in accordance with one or more embodiments of the present disclosure.

FIG. 10 depicts a block diagram of another exemplary computer-based system/platform 200 in accordance with one or more embodiments of the present disclosure. However, not all of these components may be required to practice one or more embodiments, and variations in the arrangement and type of the components may be made without departing from the spirit or scope of various embodiments of the present disclosure. In some embodiments, the member computing devices/clients 202a, 202b through 202n shown each at least includes a computer-readable medium, such as a random-access memory (RAM) 208 coupled to a processor 210 or FLASH memory. In some embodiments, the processor 210 may execute computer-executable program instructions stored in memory 208. In some embodiments, the processor 210 may include a microprocessor, an ASIC, and/or a state machine. In some embodiments, the processor 210 may include, or may be in communication with, media, for example computer-readable media, which stores instructions that, when executed by the processor 210, may cause the processor 210 to perform one or more steps described herein. In some embodiments, examples of computer-readable media may include, but are not limited to, an electronic, optical, magnetic, or other storage or transmission device capable of providing a processor, such as the processor 210 of devices/client 202a, with computer-readable instructions. In some embodiments, other examples of suitable media may include, but are not limited to, a floppy disk, CD-ROM, DVD, magnetic disk, memory chip, ROM, RAM, an ASIC, a configured processor, all optical media, all magnetic tape or other magnetic media, or any other medium from which a computer processor can read instructions. Also, various other forms of computer-readable media may transmit or carry instructions to a computer, including a router, private or public network, or other transmission device or channel, both wired and wireless. In some embodiments, the instructions may comprise code from any computer-programming language, including, for example, C, C++, Visual Basic, Java, Python, Perl, JavaScript, and etc.

In some embodiments, member computing devices/clients 202a through 202n may also comprise a number of external or internal devices such as a mouse, a CD-ROM, DVD, a physical or virtual keyboard, a display, or other input or output devices. In some embodiments, examples of member computing devices/clients 202a through 202n (e.g., clients) may be any type of processor-based platforms that are connected to a network 206 such as, without limitation, personal computers, digital assistants, personal digital assistants, smart phones, pagers, digital tablets, laptop computers, Internet appliances, and other processor-based devices. In some embodiments, member computing devices/clients 202a through 202n may be specifically programmed with one or more application programs in accordance with one or more principles/methodologies detailed herein. In some embodiments, member computing devices/clients 202a through 202n may operate on any operating system capable of supporting a browser or browser-enabled application, such as Microsoft™, Windows™, and/or Linux. In some embodiments, member computing devices 202a through 202n shown may include, for example, personal computers executing a browser application program such as Microsoft Corporation's Internet Explorer™, Apple Computer, Inc.'s Safari™, Mozilla Firefox, and/or Opera. In some embodiments, through the member computing clients/devices 202a through 202n, users 212a through 212n, may communicate over the exemplary network 206 with each other and/or with other systems and/or devices coupled to the network 206. As shown in FIG. 10, exemplary server devices 204 and 213 may be also coupled to the network 206, having processors 205 and 214. In some embodiments, one or more member computing devices/clients 202a through 202n may be mobile clients.

In some embodiments, at least one database of exemplary databases 207 and 215 may be any type of database, including a database managed by a database management system (DBMS). In some embodiments, an exemplary DBMS-managed database may be specifically programmed as an engine that controls organization, storage, management, and/or retrieval of data in the respective database. In some embodiments, the exemplary DBMS-managed database may be specifically programmed to provide the ability to query, backup and replicate, enforce rules, provide security, compute, perform change and access logging, and/or automate optimization. In some embodiments, the exemplary DBMS-managed database may be chosen from Oracle database, IBM DB2, Adaptive Server Enterprise, FileMaker, Microsoft Access, Microsoft SQL Server, MySQL, PostgreSQL, and a NoSQL implementation. In some embodiments, the exemplary DBMS-managed database may be specifically programmed to define each respective schema of each database in the exemplary DBMS, according to a particular database model of the present disclosure which may include a hierarchical model, network model, relational model, object model, or some other suitable organization that may result in one or more applicable data structures that may include fields, records, files, and/or objects. In some embodiments, the exemplary DBMS-managed database may be specifically programmed to include metadata about the data that is stored.

Figure 11:
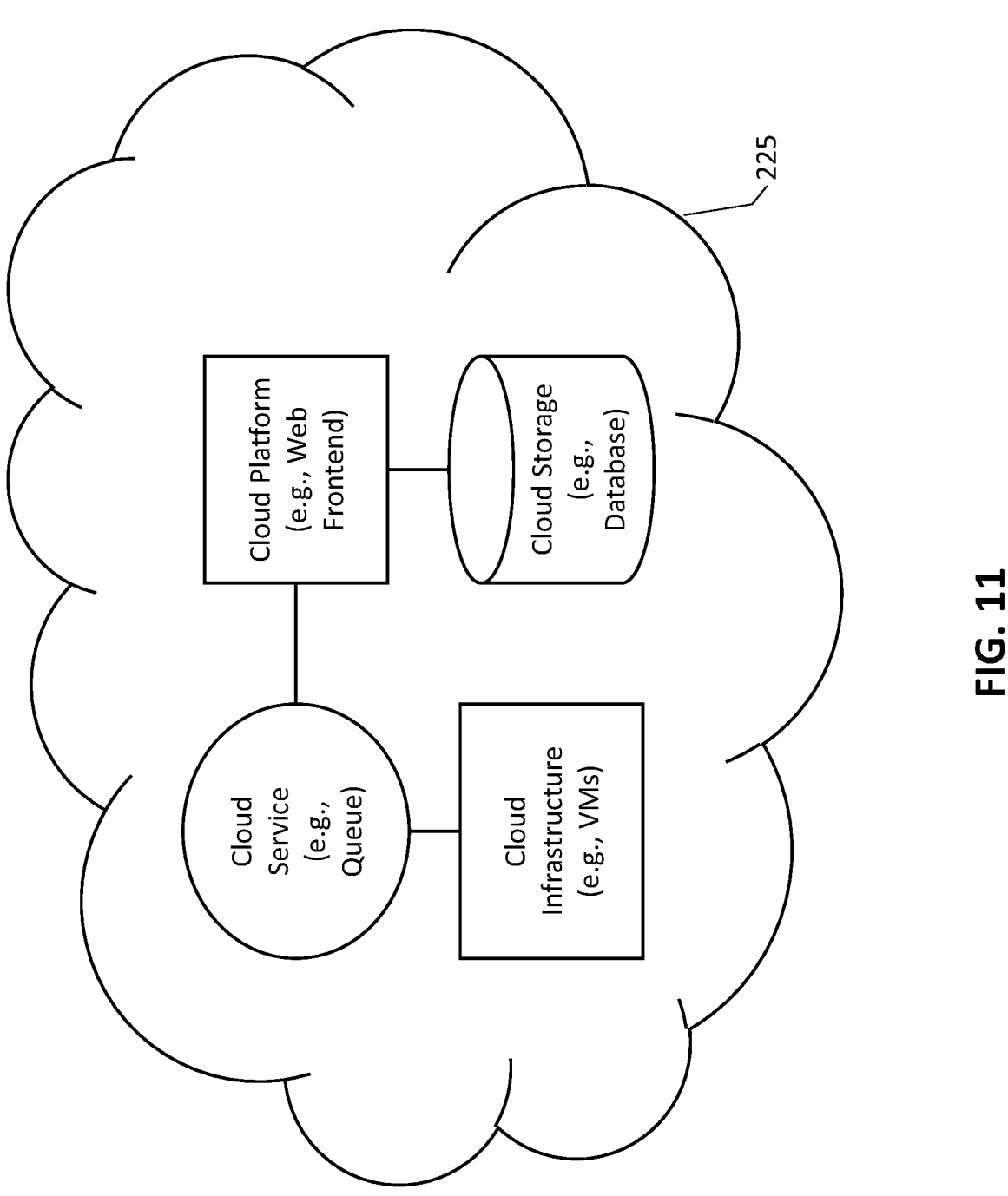
FIGS. 11 and 12 are diagrams illustrating implementations of cloud computing architecture/aspects with respect to which the disclosed technology may be specifically configured to operate, in accordance with one or more embodiments of the present disclosure.
Figure 12:
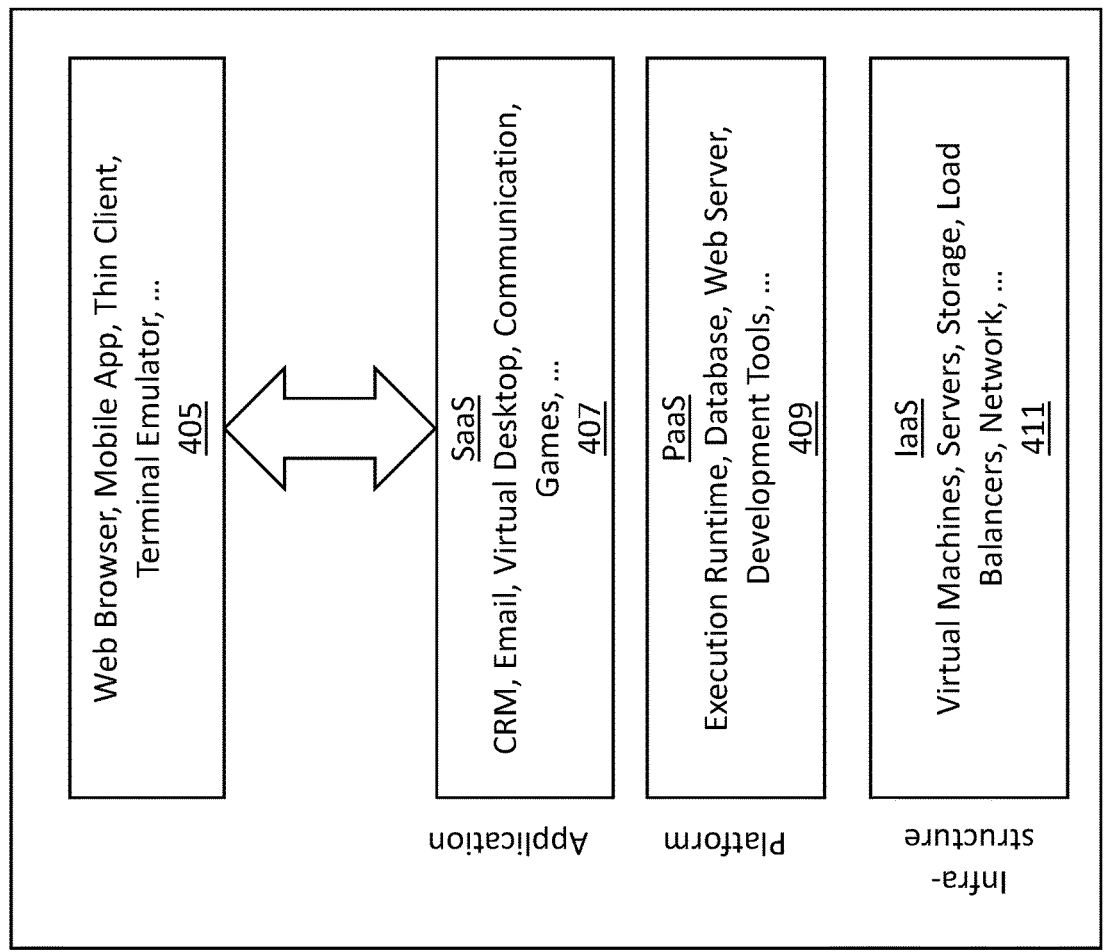

As also shown in FIGS. 10-12, some embodiments of the disclosed technology may also include and/or involve one or more cloud components 225, which are shown grouped together in the drawing for sake of illustration, though may be distributed in various ways as known in the art. Cloud components 225 may include one or more cloud services such as software applications (e.g., queue, etc.), one or more cloud platforms (e.g., a Web front-end, etc.), cloud infrastructure (e.g., virtual machines, etc.), and/or cloud storage (e.g., cloud databases, etc.).

According to some embodiments shown by way of one example in FIG. 12, the exemplary inventive computer-based systems/platforms, the exemplary inventive computer-based devices, components and media, and/or the exemplary inventive computer-implemented methods of the present disclosure (e.g., computing clients/devices 202a through 202n and/or applications thereon such as a web browser, mobile app, thin client, terminal emulator 405, etc.) may be specifically configured to operate in or with cloud computing/architecture such as, but not limiting to: infrastructure a service (IaaS) 411, platform as a service (PaaS) 409, and/or software as a service (SaaS) 407. FIGS. 11 and 12 illustrate schematics of exemplary implementations of the cloud computing/architecture(s) in which the exemplary inventive computer-based systems/platforms, the exemplary inventive computer-implemented methods, and/or the exemplary inventive computer-based devices, components and/or media of the present disclosure may be specifically configured to operate.

At least some aspects of the present disclosure will now be described with reference to the following numbered clauses.

1. A method including:
    determining, by a processor of a first computing device, a first state of a simulation being run by the first computing device;
    sending, by the processor, first data indicative of the first state of the simulation to a second computing device;
    receiving, by the processor after sending the first data, second data from the second computing device, where the second data:
        includes at least one first instruction configured to cause a first turn-based move associated with the simulation, and
        is formatted according to a specification of an application programming interface (API) configured to facilitate communication between the first computing device and the second computing device;
    determining, by the processor, a second state of the simulation based on the second data received from the second computing device;
    sending, by the processor, third data indicative of the second state of the simulation to a third computing device; and
    receiving, by the processor after sending the third data, fourth data from the third computing device, where the fourth data:
        includes at least one second instruction configured to cause a second turn-based move associated with the simulation, and
        is formatted according to the specification of the API.
2. The method of clause 1, further including determining, by the processor, a third state of the simulation based on the fourth data received from the third computing device.
3. The method of clause 2, further including sending, by the processor, fifth data indicative of the third state of the simulation to the second computing device.
4. The method of clause 2, further including:
    determining, by the processor, that at the third state of the simulation, the simulation has reached an endpoint; and
    sending, by the processor, a message indicating that the simulation has reached the endpoint to the second computing device and the third computing device.
5. The method of clause 4, where the endpoint of the simulation is associated with an end of a game being played between second computing device and the third computing device, and further where the determining that the simulation has reached the endpoint further includes determining a winner of the game.

6. The method of clause 1, further including advancing the simulation a plurality of times based on subsequent data including a plurality of instructions for making a plurality of turn-based moves, where the subsequent data is received from the second and third computing devices.

7. The method of clause 1, where the first computing device maintains a current state of the simulation throughout the simulation being run by the first computing device.

8. The method of clause 1, where the first turn-based move includes making a move in a turn-based strategy game, and further where the determining the second state of the simulation based on the second data includes implementing the first turn-based move made by the first computing device.

9. The method of clause 1, where the second computing device and the third computing device cannot directly communicate with one another.

10. The method of clause 1, where state information of the simulation is communicated to the second computing device and the third computing device only by the first computing device.

11. A system including:
  a memory; and
  at least one processor coupled to the memory, the at least one processor configured to:
  determine a first state of a simulation being run by the system;
  send first data indicative of the first state of the simulation to a first computing device;
  receive, after the first data is sent, second data from the first computing device;
  determine that the second data from the first computing device is not valid for advancing the simulation;
  send a message instructing that the second data is invalid to the first computing device;
  receive, after the message is sent, third data from the first computing device, where the third data:
    includes at least one first instruction configured to cause a first turn-based move associated with the simulation, and
    is formatted according to a specification of an application programming interface (API) configured to facilitate communication between the system and the first computing device;
  determine a second state of the simulation based on the third data received from the first computing device;
  send fourth data indicative of the second state of the simulation to a second computing device; and
  receive, after sending the fourth data, fifth data from the second computing device, where the fifth data:
    includes at least one second instruction configured to cause a second turn-based move associated with the simulation, and
    is formatted according to the specification of the API.

12. The system of clause 11, where the second data is determined to be invalid based on the second data not being formatted according to the specification of the API.

13. The system of clause 11, where the second data is determined to be invalid based on the second data including third instructions for a move associated with the simulation that is not compatible with the first state of the simulation.

14. The system of clause 11, where the system further includes a display, and further where the at least one processor is configured to send, to the display, sixth data indicative of the first state and seventh data indicative of the second state such that the display indicates a current state of the simulation.

15. The system of clause 14, where the at least one processor is further configured to send, to the display, eighth data indicative of the second data being invalid such that the display indicates that an invalid move has been made.

16. A non-transitory computer readable medium having instructions stored thereon that, upon execution by a first computing device, cause the first computing device to perform operations including:
  determining a first state of a simulation being run by the first computing device;
  sending first data indicative of the first state of the simulation to a second computing device;
  receiving, after the first data is sent, second data from the second computing device, where the second data:
    includes at least one first instruction configured to cause a first move associated with the simulation, and
    is formatted according to a specification configured to facilitate communication between the first computing device and the second computing device;
  determining a second state of the simulation based on the second data received from the second computing device;
  sending third data indicative of the second state of the simulation to a third computing device; and
  receiving, after sending the third data, fourth data from the third computing device, where the fourth data:
    includes at least one second instruction configured to cause a second move associated with the simulation, and is formatted according to the specification.

17. The non-transitory computer readable medium of clause 16, where the first move and the second move are each a turn-based move.

18. The non-transitory computer readable medium of clause 16, where the first move and the second move are each a real-time strategy game move.

19. The non-transitory computer readable medium of clause 18, where the simulation includes a real-time strategy game simulation.

20. The non-transitory computer readable medium of clause 19, where state information of the simulation is continuously and simultaneously communicated to the second computing device and the third computing device by the first computing device.

As used herein, the terms "computer engine" and "engine" identify at least one software component and/or a combination of at least one software component and at least one hardware component which are designed/programmed/configured to manage/control other software and/or hardware components (such as the libraries, software development kits (SDKs), objects, etc.).

Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. In some embodiments, the one or more processors may be implemented as a Complex Instruction Set Computer (CISC) or Reduced Instruction Set Computer (RISC) processors; x86 instruction set compatible processors, multi-core, or any other microprocessor or central processing unit (CPU). In various implementations, the one or more processors may be dual-core processor(s), dual-core mobile processor(s), and so forth.

Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores," may be stored on a tangible, machine readable medium and supplied to various customers or manufacturing facilities to load into the fabrication machines that make the logic or processor. Of note, various embodiments described herein may, of course, be implemented using any appropriate hardware and/or computing software languages (e.g., C++, Objective-C, Swift, Java, JavaScript, Python, Perl, QT, etc.).

In some embodiments, one or more of exemplary inventive computer-based systems/platforms, exemplary inventive computer-based devices, and/or exemplary inventive computer-based components of the present disclosure may include or be incorporated, partially or entirely into at least one personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

As used herein, the term "server" should be understood to refer to a service point which provides processing, database, and communication facilities. By way of example, and not limitation, the term "server" can refer to a single, physical processor with associated communications and data storage and database facilities, or it can refer to a networked or clustered complex of processors and associated network and storage devices, as well as operating software and one or more database systems and application software that support the services provided by the server. Cloud components (e.g., FIGS. 11 and 12) and cloud servers are examples.

In some embodiments, as detailed herein, one or more of the computer-based systems of the present disclosure may obtain, manipulate, transfer, store, transform, generate, and/or output any digital object and/or data unit (e.g., from inside and/or outside of a particular application) that can be in any suitable form such as, without limitation, a file, a contact, a task, an email, a message, a map, an entire application (e.g., a calculator), data points, and other suitable data. In some embodiments, as detailed herein, one or more of the computer-based systems of the present disclosure may be implemented across one or more of various computer platforms such as, but not limited to: (1) Linux™, (2) Microsoft Windows™, (3) OS X (Mac OS), (4) Solaris™, (5) UNIX™ (6) VMWare™, (7) Android™, (8) Java Platforms™, (9) Open Web Platform, (10) Kubernetes or other suitable computer platforms. In some embodiments, illustrative computer-based systems or platforms of the present disclosure may be configured to utilize hardwired circuitry that may be used in place of or in combination with software instructions to implement features consistent with principles of the disclosure. Thus, implementations consistent with principles of the disclosure are not limited to any specific combination of hardware circuitry and software. For example, various embodiments may be embodied in many different ways as a software component such as, without limitation, a stand-alone software package, a combination of software packages, or it may be a software package incorporated as a "tool" in a larger software product.

For example, exemplary software specifically programmed in accordance with one or more principles of the present disclosure may be downloadable from a network, for example, a website, as a stand-alone product or as an add-in package for installation in an existing software application. For example, exemplary software specifically programmed in accordance with one or more principles of the present disclosure may also be available as a client-server software application, or as a web-enabled software application. For example, exemplary software specifically programmed in accordance with one or more principles of the present disclosure may also be embodied as a software package installed on a hardware device.

In some embodiments, illustrative computer-based systems or platforms of the present disclosure may be configured to handle numerous concurrent users that may be, but is not limited to, at least 100 (e.g., but not limited to, 100-999), at least 1,000 (e.g., but not limited to, 1,000-9, 999), at least 10,000 (e.g., but not limited to, 10,000-99, 999), at least 100,000 (e.g., but not limited to, 100,000-999, 999), at least 1,000,000 (e.g., but not limited to, 1,000,000-9,999,999), at least 10,000,000 (e.g., but not limited to, 10,000,000-99,999,999), at least 100,000,000 (e.g., but not limited to, 100,000,000-999,999,999), at least 1,000,000,000 (e.g., but not limited to, 1,000,000,000-999,999,999, 999), and so on.

In some embodiments, exemplary inventive computer-based systems/platforms, exemplary inventive computer-based devices, and/or exemplary inventive computer-based components of the present disclosure may be configured to output to distinct, specifically programmed graphical user interface implementations of the present disclosure (e.g., a desktop, a web app., etc.). In various implementations of the present disclosure, a final output may be displayed on a displaying screen which may be, without limitation, a screen of a computer, a screen of a mobile device, or the like. In various implementations, the display may be a holographic display. In various implementations, the display may be a transparent surface that may receive a visual projection. Such projections may convey various forms of information, images, and/or objects. For example, such projections may be a visual overlay for a mobile augmented reality (MAR) application.

In some embodiments, exemplary inventive computer-based systems/platforms, exemplary inventive computer-based devices, and/or exemplary inventive computer-based components of the present disclosure may be configured to be utilized in various applications which may include, but not limited to, gaming, mobile-device games, video chats, video conferences, live video streaming, video streaming and/or augmented reality applications, mobile-device messenger applications, and others similarly suitable computer-device applications.

As used herein, the term "mobile electronic device," or the like, may refer to any portable electronic device that may or may not be enabled with location tracking functionality (e.g., MAC address, Internet Protocol (IP) address, or the like). For example, a mobile electronic device can include, but is not limited to, a mobile phone, Personal Digital Assistant (PDA), Blackberry™, Pager, Smartphone, or any other reasonable mobile electronic device.

As used herein, the terms "proximity detection," "locating," "location data," "location information," and "location tracking" refer to any form of location tracking technology or locating method that can be used to provide a location of, for example, a particular computing device/system/platform of the present disclosure and/or any associated computing devices, based at least in part on one or more of the following techniques/devices, without limitation: accelerometer(s), gyroscope(s), Global Positioning Systems (GPS); GPS accessed using Bluetooth™; GPS accessed using any reasonable form of wireless and/or non-wireless communication; WiFi™ server location data; Bluetooth™ based location data; triangulation such as, but not limited to, network based triangulation, WiFi™ server information based triangulation, Bluetooth™ server information based triangulation; Cell Identification based triangulation, Enhanced Cell Identification based triangulation, Uplink-Time difference of arrival (U-TDOA) based triangulation, Time of arrival (TOA) based triangulation, Angle of arrival (AOA) based triangulation; techniques and systems using a geographic coordinate system such as, but not limited to, longitudinal and latitudinal based, geodesic height based, Cartesian coordinates based; Radio Frequency Identification such as, but not limited to, Long range RFID, Short range RFID; using any form of RFID tag such as, but not limited to active RFID tags, passive RFID tags, battery assisted passive RFID tags; or any other reasonable way to determine location. For ease, at times the above variations are not listed or are only partially listed; this is in no way meant to be a limitation.

In some embodiments, the exemplary inventive computer-based systems/platforms, the exemplary inventive computer-based devices, and/or the exemplary inventive computer-based components of the present disclosure may be configured to securely store and/or transmit data by utilizing one or more of encryption techniques (e.g., private/public key pair, Triple Data Encryption Standard (3DES), block cipher algorithms (e.g., IDEA, RC2, RC5, CAST and Skipjack), cryptographic hash algorithms (e.g., MD5, RIP-EMD-160, RTRO, SHA-1, SHA-2, Tiger (TTH),WHIRL-POOL, RNGs).

Publications cited throughout this document are hereby incorporated by reference in their entirety. While one or more embodiments of the present disclosure have been described, it is understood that these embodiments are illustrative only, and not restrictive, and that many modifications may become apparent to those of ordinary skill in the art, including that various embodiments of the inventive methodologies, the inventive systems/platforms, and the inventive devices described herein can be utilized in any combination with each other. Further still, the various steps may be carried out in any desired order (and any desired steps may be added and/or any desired steps may be eliminated).

What is claimed is:
1. A method comprising:
determining, by a processor of a first computing device, a first state of a simulation being run by the first computing device;
sending, by the processor, first data indicative of the first state of the simulation to a second computing device;

receiving, by the processor after sending the first data, second data from the second computing device, wherein the second data:
comprises at least one first instruction configured to cause a first turn-based move associated with the simulation, and
is formatted according to a specification of an application programming interface (API) configured to facilitate communication between the first computing device and the second computing device;
determining, by the processor, a second state of the simulation based on the second data received from the second computing device;
sending, by the processor, third data indicative of the second state of the simulation to a third computing device; and
receiving, by the processor after sending the third data, fourth data from the third computing device, wherein the fourth data:
comprises at least one second instruction configured to cause a second turn-based move associated with the simulation, and
is formatted according to the specification of the API.
2. The method of claim 1, further comprising determining, by the processor, a third state of the simulation based on the fourth data received from the third computing device.
3. The method of claim 2, further comprising sending, by the processor, fifth data indicative of the third state of the simulation to the second computing device.
4. The method of claim 2, further comprising:
determining, by the processor, that at the third state of the simulation, the simulation has reached an endpoint; and
sending, by the processor, a message indicating that the simulation has reached the endpoint to the second computing device and the third computing device.
5. The method of claim 4, wherein the endpoint of the simulation is associated with an end of a game being played between second computing device and the third computing device, and further wherein the determining that the simulation has reached the endpoint further comprises determining a winner of the game.
6. The method of claim 1, further comprising advancing the simulation a plurality of times based on subsequent data comprising a plurality of instructions configured to cause a plurality of turn-based moves, wherein the subsequent data is received from the second and third computing devices.
7. The method of claim 1, wherein the first computing device maintains a current state of the simulation throughout the simulation being run by the first computing device.
8. The method of claim 1, wherein the first turn-based move comprises making a move in a turn-based strategy game, and further wherein the determining the second state of the simulation based on the second data comprises implementing the first turn-based move made by the first computing device.
9. The method of claim 1, wherein the second computing device and the third computing device cannot directly communicate with one another.
10. The method of claim 1, wherein state information of the simulation is communicated to the second computing device and the third computing device only by the first computing device.
11. A system comprising:
a memory; and
at least one processor coupled to the memory, the at least one processor configured to:

determine a first state of a simulation being run by the system;

send first data indicative of the first state of the simulation to a first computing device;

receive, after the first data is sent, second data from the first computing device;

determine that the second data from the first computing device is not valid for advancing the simulation;

send a message instructing that the second data is invalid to the first computing device;

receive, after the message is sent, third data from the first computing device, wherein the third data:

comprises at least one first instruction configured to cause a first turn-based move associated with the simulation, and is formatted according to a specification of an application programming interface (API) configured to facilitate communication between the system and the first computing device;

determine a second state of the simulation based on the third data received from the first computing device;

send fourth data indicative of the second state of the simulation to a second computing device; and receive, after sending the fourth data, fifth data from the second computing device, wherein the fifth data:

comprises at least one second instruction configured to cause a second turn-based move associated with the simulation, and is formatted according to the specification of the API.

12. The system of claim 11, wherein the second data is determined to be invalid based on the second data not being formatted according to the specification of the API.

13. The system of claim 11, wherein the second data is determined to be invalid based on the second data comprising third instructions for a move associated with the simulation that is not compatible with the first state of the simulation.

14. The system of claim 11, wherein the system further comprises a display, and further wherein the at least one processor is configured to send, to the display, sixth data indicative of the first state and seventh data indicative of the second state such that the display indicates a current state of the simulation.

15. The system of claim 14, wherein the at least one processor is further configured to send, to the display, eighth data indicative of the second data being invalid such that the display indicates that an invalid move has been made.

16. A non-transitory computer readable medium having instructions stored thereon that, upon execution by a first computing device, cause the first computing device to perform operations comprising:

determining a first state of a simulation being run by the first computing device;

sending first data indicative of the first state of the simulation to a second computing device;

receiving, after the first data is sent, second data from the second computing device, wherein the second data:

comprises at least one first instruction configured to cause a first move associated with the simulation, and is formatted according to a specification configured to facilitate communication between the first computing device and the second computing device;

determining a second state of the simulation based on the second data received from the second computing device;

sending third data indicative of the second state of the simulation to a third computing device; and receiving, after sending the third data, fourth data from the third computing device, wherein the fourth data:

comprises at least one second instruction configured to cause a second move associated with the simulation, and is formatted according to the specification.

17. The non-transitory computer readable medium of claim 16, wherein the first move and the second move are each a turn-based move.

18. The non-transitory computer readable medium of claim 16, wherein the first move and the second move are each a real-time strategy game move.

19. The non-transitory computer readable medium of claim 18, wherein the simulation comprises a real-time strategy game simulation.

20. The non-transitory computer readable medium of claim 19, wherein state information of the simulation is continuously and simultaneously communicated to the second computing device and the third computing device by the first computing device.

\* \* \* \* \*